United States Patent
Seong et al.

(10) Patent No.: US 7,190,002 B2
(45) Date of Patent: Mar. 13, 2007

(54) FLIP-CHIP NITRIDE LIGHT EMITTING DEVICE AND METHOD OF MANUFACTURING THEREOF

(75) Inventors: Tae-yeon Seong, Gwangju-si (KR); June-o Song, Gwangju-si (KR)

(73) Assignees: Samsung Electronics Co., Ltd., Suwon-si (KR); Gwangju Institute of Science and Technology, Gwangju-si (KR)

( * ) Notice: Subject to any disclaimer, the term of this patent is extended or adjusted under 35 U.S.C. 154(b) by 30 days.

(21) Appl. No.: 11/016,956

(22) Filed: Dec. 21, 2004

(65) Prior Publication Data

US 2005/0133803 A1     Jun. 23, 2005

(30) Foreign Application Priority Data

Dec. 22, 2003   (KR) .................... 10-2003-0094684

(51) Int. Cl.
*H01L 33/00*     (2006.01)
(52) U.S. Cl. .................. 257/98; 257/99; 257/101; 257/102; 257/103; 257/E33.64
(58) Field of Classification Search ................ 257/96, 257/98, 99, 101–103
See application file for complete search history.

(56) References Cited

U.S. PATENT DOCUMENTS

2002/0171087 A1   11/2002  Krames et al.

FOREIGN PATENT DOCUMENTS

| JP | 2000-164928 | 6/2000 |
|---|---|---|
| JP | 2002-151739 | 5/2002 |

OTHER PUBLICATIONS

Korean Office Action dated Oct. 27, 2005.

*Primary Examiner*—Thien F. Tran
(74) *Attorney, Agent, or Firm*—Buchanan Ingersoll & Rooney PC

(57) ABSTRACT

A flip-chip light emitting device and a method of manufacturing thereof are provided. The flip-chip nitride light emitting device includes a substrate, an n type clad layer, an active layer, a p type clad layer, a multi ohmic contact layer, and a reflective layer, which are stacked in this order, wherein the multi ohmic contact layer is obtained by repeatedly stacking at least one stack unit of a reforming metal layer and a transparent conductive thin film, and wherein the reforming metal layer mainly contains silver (Ag). According to the flip-chip light emitting device and the method of manufacturing thereof, since the ohmic contact characteristics associated with a p type clad layer can be improved, it is possible to increase wire bonding efficiency and yield in a packaging process. In addition, since a low non-contact resistance and a good current-voltage characteristic can be obtained, it is possible to improve light emitting efficiency and to expand life time of the flip-chip light emitting device.

7 Claims, 3 Drawing Sheets

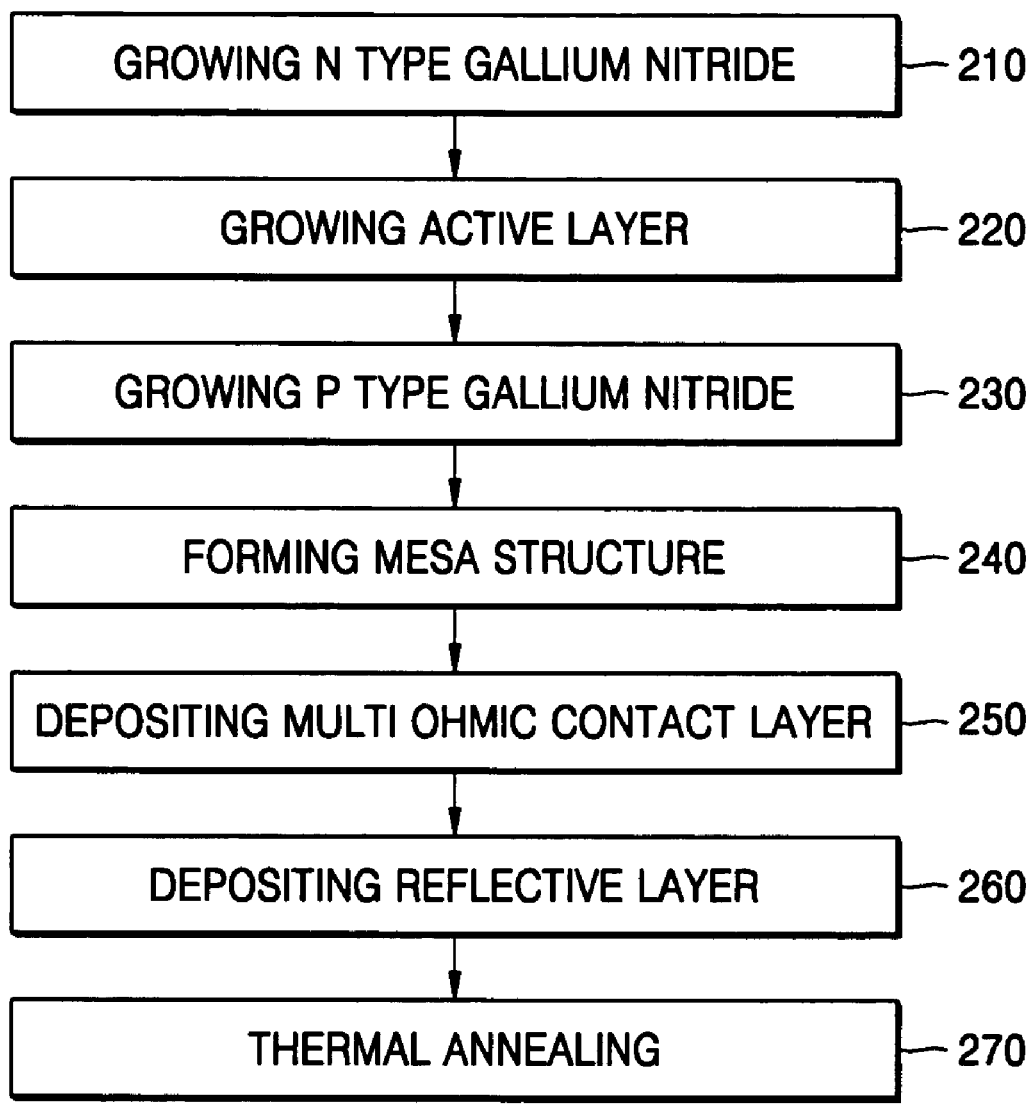

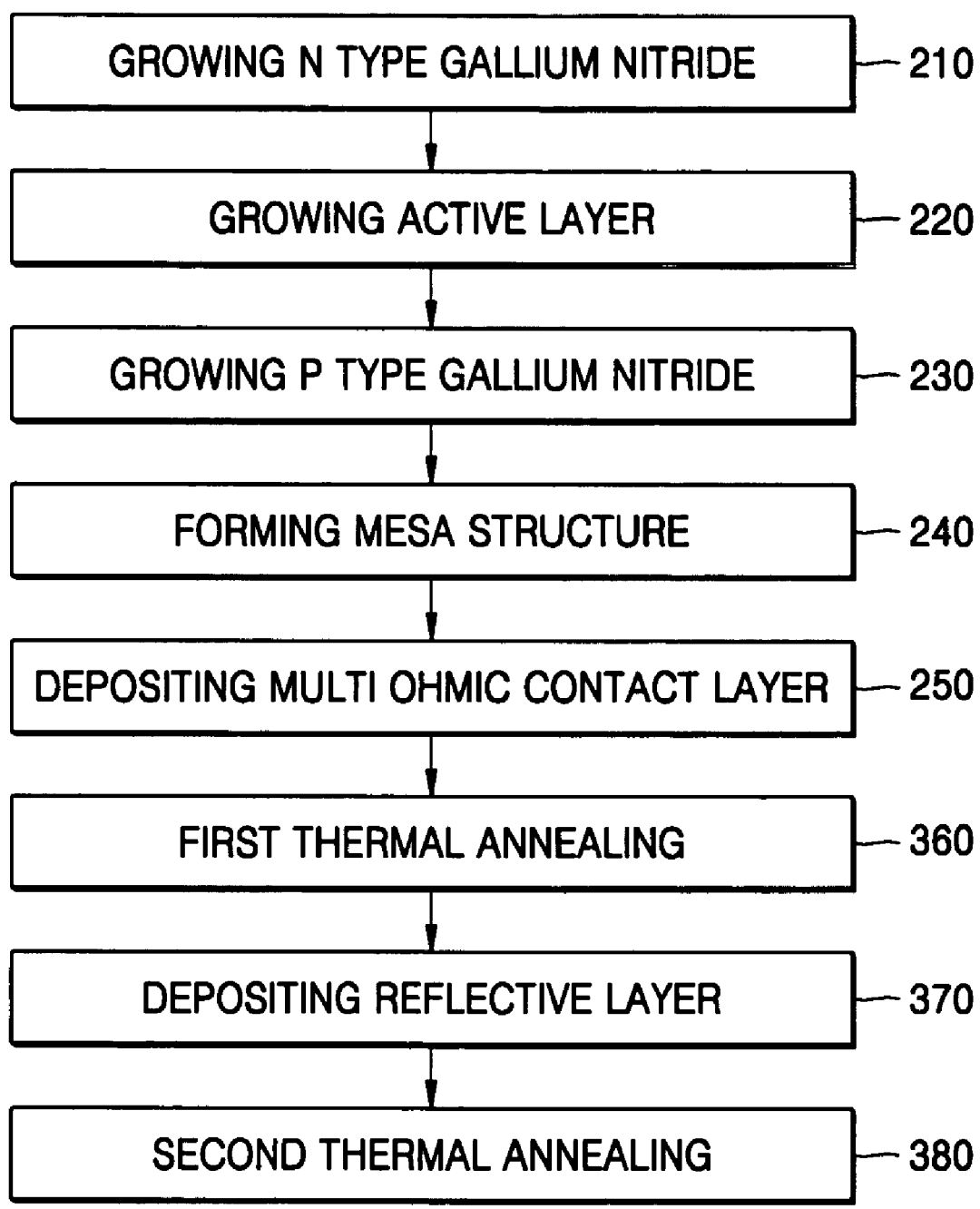

FLIP-CHIP NITRIDE LIGHT EMITTING DEVICE AND METHOD OF MANUFACTURING THEREOF

BACKGROUND OF THE INVENTION

Priority is claimed to Korean Patent Application No. 2003-94684, filed on Dec. 22, 2003, in the Korean Intellectual Property Office, the disclosure of which is incorporated herein in its entirety by reference.

1. Field of the Invention

The present invention relates to a flip-chip nitride light emitting device and a method of manufacturing thereof, and more particularly, to a flip-chip nitride light emitting device having an electrode structure capable of improving light emitting efficiency and a method of manufacturing thereof.

2. Description of the Related Art

In technology for manufacturing light emitting devices such as light emitting diodes and laser diodes by using nitride compound semiconductors such as gallium nitride semiconductors, ohmic contact structures between the semiconductors and electrodes are very important. Currently, commercially-available gallium nitride light emitting devices are formed on insulating sapphire ($Al_2O_3$) substrates.

These gallium nitride light emitting devices are classified into top-emitting light emitting devices (TLEDs) and flip-chip light emitting devices (FCLEDs).

The top-emitting light emitting devices emit light through an ohmic electrode layer in contact with a p type clad layer.

The top-emitting light emitting devices have poor electrical characteristics such as a low current injection and current spreading, which result from the thin film characteristics of the p type clad layer that has a low concentration of holes. These poor electrical characteristics can be overcome by using an ohmic contact electrode having a high transmittance and a low sheet resistance.

In general, the top-emitting light emitting devices have a metal thin film structure which mainly contains a transition metal such as nickel (Ni). In particular, oxidized semi-transparent metal thin films of nickel (Ni)/gold (Au) have been widely used for the top-emitting light emitting devices.

It is disclosed that, if a metal thin film mainly containing nickel (Ni) is subject to a thermal annealing process in oxygen ($O_2$) ambience, a semi-transparent ohmic contact layer having a non-contact resistance of $10^{-3}$ to $10^{-4}$ $\Omega \cdot cm^2$ can be obtained.

Such a low non-contact resistance results in the decrease in Schottky barrier height (HBT). As a result, when being thermally annealed under an oxygen atmosphere ($O^2$) at a temperature ranging from 500 to 600° C., major carriers, that is, holes can be easily supplied in a vicinity of a surface of the gallium nitride, so that an effective concentration in a vicinity of the surface of the gallium nitride can increase. On the other hand, if the stacked structure of nickel (Ni)/gold (Au) is in contact with the p type gallium nitride and subject to an thermal annealing process, complexes between magnesium (Mg) and hydrogen (H) can be removed and reactivation phenomenon occurs, so that the concentration of the dopant of magnesium (Mg) on the surface of gallium nitride. As a result, the effective concentration of carriers on the surface of gallium nitride becomes $10^{19}$ or more and tunneling conduction on the interface between the gallium nitride and the electrode (nickel oxide) occurs, so that the ohmic conduction characteristics can be obtained.

However, there is a problem in that the top-emitting light emitting devices implemented by using the semi-transparent electrode thin film of nickel (Ni)/gold (Au) has too low light emitting efficiency to implement a large-capacity high-brightness light emitting device.

Recently, in order to implement a large-capacity high-brightness light emitting device, there have been demands for developing flip-chip light emitting devices implemented by using one of silver (Ag), silver oxide ($Ag_2O$) and aluminum (Al), which are popularly used as a material of a highly reflective layer.

Although these metals having a high reflectance temporarily provides a high light emitting efficiency, it is difficult to form a low non-contact resistance ohmic contact due to their low work function, so that the life time of the flip-chip light emitting devices may be shortened and contact characteristics thereof associated with the gallium nitride can be deteriorated. As a result, there is a problem in that the flip-chip light emitting devices cannot provide a good contact characteristic and durability.

More specifically, since aluminum (Al) metal having a low work function and forming nitride during a thermal annealing process has a tendency to form a Schottky contact other than an ohmic contact at the interface of the p type gallium nitride, the aluminum (Al) metal barely can be used. Unlike aluminum (Al) metal, silver (Ag) metal forms the ohmic contact with the gallium nitride. However, since silver (Ag) metal has a poor mechanical adhesion to the gallium nitride and thermal instability, there is a problem in that it is difficult to ensure reliability of manufacturing and operation the light emitting devices.

In order to solve the problems, ohmic contact layers having a low non-contact resistance and a high reflectance have been actively researched and developed.

Mensz et al. proposed a two-layered structure of nickel (Ni)/aluminum (AL) and nickel (Ni)/silver (Ag) in an article (Electronics Letters 33 (24) pp. 2066). However, since this two-layered structure cannot easily form the ohmic contact, there is a problem in that a large amount of heat is generated due to a high operating voltage of the light emitting diode.

Recently, Michael R. Krames et al. disclosed an electrode structure of nickel (Ni)/silver (Ag) and gold (Au)/nickel oxide ($NiO_x$)/aluminum (Al) in U.S. Patent Publication No. US 2002/0171087 A1. However, there is a problem in that the electrode structure has a poor adhesion and light emitting efficiency is lowered due to its diffused reflection.

SUMMARY OF THE INVENTION

The present invention provides a flip-chip nitride light emitting device having an electrode structure having a good adhesion and a low non-contact resistance and a method of manufacturing thereof to solve the problems.

According to an aspect of the present invention, there is provided a flip-chip nitride light emitting device comprising: an n type clad layer; a p type clad layer; an active layer disposed between the n and p type clad layers; and a reflective layer disposed on the p type clad layer, wherein a multi ohmic contact layer obtained by repeatedly stacking at least one stack unit of a reforming metal layer and a transparent conductive thin film is disposed between the p type clad layer and the refection layer, and wherein the reforming metal layer mainly contains silver (Ag).

The transparent conductive thin film may be made of one of a transparent conductive oxide (TCO) and a transparent conductive nitride (TCN). The transparent conductive oxide may be made of a material obtained by combining oxygen (O) with at least one metal of indium (In), tin (Sn), zinc (Zn), gallium (Ga), cadmium (Cd), magnesium (Mg), beryllium (Be), silver (Ag), molybdenum (Mo), vanadium (V), copper (Cu), Iridium (Ir), rhodium (Rh), ruthenium (Ru), tungsten (W), cobalt (Co), nickel (Ni), manganese (Mn), aluminum (Al), and one of lanthanide (La) series. The transparent conductive thin film may be made of a material containing titanium (Ti) and nitrogen (N).

Preferably, the reforming metal layer may have a thickness ranging from 1 to 20 nanometers.

In addition, the reflective layer may be made of at least one of silver (Ag), silver oxide ($Ag_2O$), zinc (Zn), titanium (Ti), rhodium (Rh), magnesium (Mg), palladium (Pd), ruthenium (Ru), and aluminum (Al).

The transparent conductive thin film may have a thickness ranging from 10 to 1,000 nanometers, and the reflective layer may have a thickness ranging from 100 to 1,000 nanometers.

In addition, according to another aspect of the present invention, there is provided a method of manufacturing a flip-chip nitride light emitting device having an n type clad layer, a p type clad layer, an active layer disposed between the n and p type clad layers, and a reflective layer disposed on the p type clad layer, comprising: forming a multi ohmic contact layer by repeatedly stacking at least one stack unit of a reforming metal layer and a transparent conductive thin film on the p type clad layer, wherein the n type clad layer, the active layer, and the p type clad layer constitutes a light emitting structure; forming a reflective layer on the multi ohmic contact layer, wherein the reforming metal layer mainly contains silver (Ag).

The method may further comprise performing a thermal annealing process after forming the multi ohmic contact layer or after forming the reflective layer.

BRIEF DESCRIPTION OF THE DRAWINGS

The above and other features and advantages of the present invention will become more apparent by describing in detail exemplary embodiments thereof with reference to the attached drawings in which:

FIG. 2 is a flowchart showing a method of manufacturing a light emitting device according to an embodiment of the present invention; and FIG. 3 is a flowchart showing a series of processes of manufacturing a light emitting device according to another embodiment of the present invention.

DETAILED DESCRIPTION OF THE PREFERRED EMBODIMENTS

Figure 1:
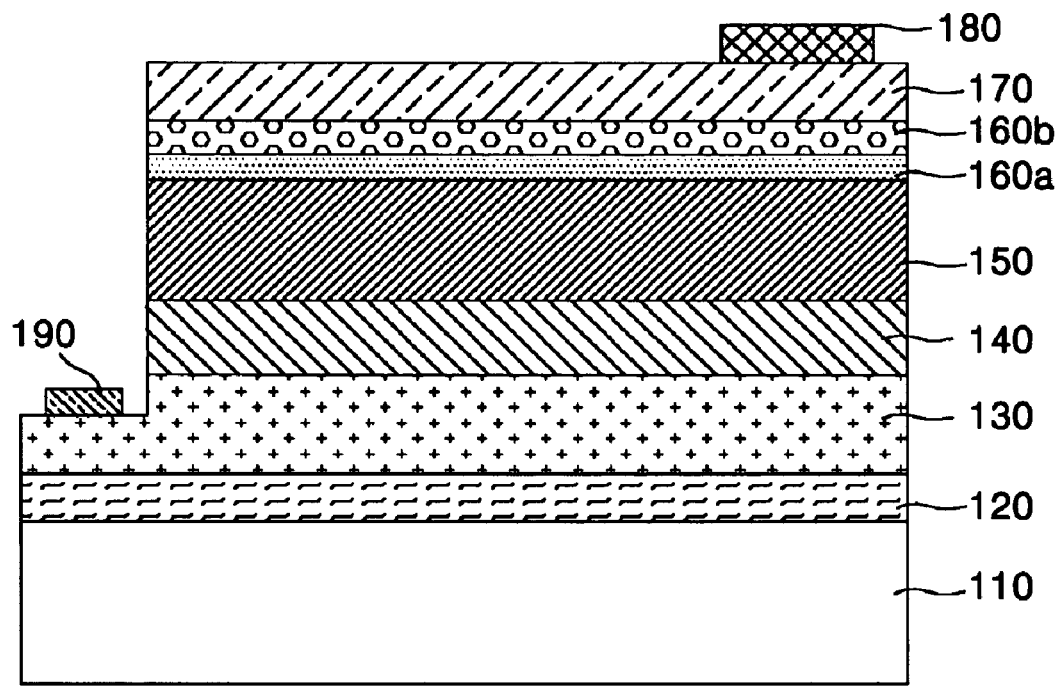
FIG. 1 is a cross sectional view showing a light emitting device having a multi ohmic contact layer according to an embodiment of the present invention.

Now, an embodiment of a flip-chip light emitting device and a method of manufacturing thereof will be described in detail with reference to the accompanying drawings.

FIG. 1 is a cross sectional view showing a flip-chip light emitting device having a multi ohmic contact layer according to a first embodiment of the present invention.

The flip-chip light emitting device includes a substrate 110, a buffer layer 120, an n type clad layer 130, an active layer 140, a p type clad layer 150, a multi ohmic contact layer 160, and a reflective layer 170, which are stacked from the bottom in this order. Reference numerals 180 and 190 indicate p type and n type electrode pads, respectively.

The multi ohmic contact layer 160 includes a reforming metal layer 160a and a transparent conductive thin film 160b stacked on the reforming metal layer 160.

The stacked structure from the substrate 110 to the p type clad layer 150 is a light emitting structure. The multi ohmic contact layer 160 stacked on the p type clad layer 150 is a p type electrode structure.

Preferably, the substrate 110 is made of one of sapphire ($Al_2O_3$), silicon carbide (SiC), silicon (Si), gallium arsenide (GaAs).

The buffer layer 120 may be omitted.

Each of the layers from the buffer layer 120 to the p type clad layer 150 mainly contains one of Group III nitride compounds represented with a general formula: $Al_xIn_yGa_zN$ ($0 \leq x \leq 1$, $0 \leq y \leq 1$, $0 \leq z \leq 1$, $0 \leq x+y+z \leq 1$). The n type clad layer 130 and p type clad layer 150 are added with the respective dopants.

In addition, the active layer 140 may be formed as a single layer, a multiple quantum well (MQW) layer, and others by using various well-known methods.

In an example where the GaN compound is used, the buffer layer 120 is made of GaN; the n type clad layer 130 is made of GaN added with an n type dopant such as Si, Ge, Se, and Te; the active layer 140 is made of InGaN/GaN MQW or AlGaN/GaN MQW; and the p type clad layer 150 is made of GaN added with an p type dopant such as Mg, Zn, Ca, Sr, and Ba.

An n type ohmic contact layer (not shown) may be interposed between the n type clad layer 130 and the n type electrode pad 190. The n type ohmic contact layer may be one of various well-known stacked structures including a titanium (Ti) layer and an aluminum (Al) layer stacked thereon.

The p type electrode pad 180 may be a stacked structure of nickel (Ni)/gold (Au) or silver (Ag)/gold (Au).

The method of forming the aforementioned layers may be one of well-known deposition methods such as physical vapor deposition (PVD), chemical vapor deposition (CVD), plasma laser deposition (PLD), dual-type thermal evaporator, sputtering methods, and e-beam evaporator.

Preferably, the multi ohmic contact layer 160 is made of a material increasing an effective concentration of carriers in the p type clad layer 150 and having a preferential reactivity with not nitrogen (N) but other components of the compounds constituting the p type clad layer 150. For example, in case of a GaN compound constituting the p type clad layer 150, the multi ohmic contact layer 160 is made of a material having a preferential reactivity with not nitrogen (N) but gallium (Ga).

In this case, if the p type clad layer 150 mainly contains gallium nitride (GaN), gallium (Ga) of a p type clad layer reacts with the multi ohmic contact layer 160 due to the aforementioned characteristics of the multi ohmic contact layer 160, gallium vacancies are formed on a surface of the p type clad layer 150. The gallium vacancies function as a p type dopant. Therefore, the effective concentration of p type carriers on the surface of the p type clad layer 150 can increase due to the reaction of the p type clad layer 150 and the multi ohmic contact layer 160.

In addition, the multi ohmic contact layer 160 is also made of a material remaining on the surface of the p type clad layer 150 and decreasing the height and width of Schottky barrier by reducing gallium oxide ($Ga_2O_3$), that is, a natural oxide layer functioning as a barrier to a carrier flow on the interface. The aforementioned formation of the gallium vacancies, reduction function of the natural oxide layer, and formation of the transparent conductive oxide layer may result in tunneling conduction on the interface between a gallium nitride semiconductor and a contact metal electrode.

Such a multi ohmic contact layer 160 satisfying the aforementioned conditions includes the reforming metal layer 160a stacked on the p type clad layer 150 and the transparent conductive thin film 160b stacked on the reforming metal layer 160a.

The reforming metal layer 160a is made of a material having a high electrical conductivity, being easily decomposed into conductive nano phase particles in oxygen ambience at a temperature of 600° C. or less, and being hard to oxidize.

Silver (Ag) can be used for the reforming metal layer 160a satisfying the aforementioned conditions.

Preferably, the reforming metal layer 160a is made of only the silver (Ag). Alternatively, the reforming metal layer 160a may be made of an alloy or a solid solution mainly containing silver (Ag).

In addition, preferably, the reforming metal layer 160 a constituting the multi ohmic contact layer 160 has a thickness ranging from 1 to 20 nanometers, so that reforming metal layer 160a can be easily decomposed into conductive nano phase particles when being thermally annealed.

The transparent conductive thin film 160b is made of one of a transparent conductive oxide (TCO) and a transparent conductive nitride (TCN).

The transparent conductive oxide (TCO) is made of a material obtained by combining oxygen (O) with at least one metal of indium (In), tin (Sn), zinc (Zn), gallium (Ga), cadmium (Cd), magnesium (Mg), beryllium (Be), silver (Ag), molybdenum (Mo), vanadium (V), copper (Cu), Iridium (Ir), rhodium (Rh), ruthenium (Ru), tungsten (W), cobalt (Co), nickel (Ni), manganese (Mn), aluminum (Al), and one of lanthanide (La) series.

The material used to form the transparent conductive oxide is selected based on its work function and sheet resistance rather than other characteristics.

Preferably, the transparent conductive nitride (TCN) is made of nitrogen (N) and titanium (Ti) having a low sheet resistance and a high transmittance.

In addition, the transparent conductive oxide (TCO) and the transparent conductive nitride (TCN) constituting the transparent conductive thin film 160b may be formed by adding a metal dopant to the main component in order to improve electrical characteristics, wherein the metal dopant is selected from at least one of metal elements in the periodic table.

Preferably, the adding ratio of the metal dopant ranges from 0.001 to 20 wt % in order to improve electrical characteristics of the transparent conductive oxide (TCO) and transparent conductive nitride (TCN). The wt % denotes the weight of the adding dopant as a percentage of the weight of the main components.

In addition, preferably, the transparent conductive thin film 160b has a thickness ranging from 10 to 1,000 nanometers, so that transparent conductive thin film 160b can have a suitable transmittance and electrical conductivity.

Preferably, the multi ohmic contact layer 160 is formed by using one of an e-beam evaporator, a thermal evaporator, a sputtering deposition apparatus, and a laser deposition apparatus.

In addition, the evaporation process for forming the multi ohmic contact layer 160 is performed at a temperature of 20 to 1,500° C. under a pressure of atmospheric pressure to $10^{-12}$ torr.

In addition, preferably, after the multi ohmic contact layer 160 is formed, a thermal annealing process is performed.

The thermal annealing process is performed in vacuum or gas ambience at a temperature of 100 to 800° C. for a time interval of 10 seconds to 3 hours.

The gas in a chamber used for the thermal annealing process may be at least one of nitrogen, argon, helium, oxygen, hydrogen, and air.

By performing the thermal annealing process in the aforementioned ambience and temperature conditions, the multi ohmic contact layer 160 can include the transparent conductive oxide (TCO) having a high transmittance of 90% at $\Lambda = 400$ nm and a low sheet resistance of 10 $\Omega/cm^2$ and have a deceasing width of Schottky barrier by reducing gallium oxide ($Ga_2O_3$), that is, a natural oxide layer formed on the p type gallium nitride. As a result, tunneling conduction useful for the ohmic contact formation can be induced, so that electrical characteristics can be improved and a transmittance of near 100% can be obtained.

The reflective layer 170 is formed by using a highly reflective material, which is made of at least one of silver (Ag), silver oxide ($Ag_2O$), zinc (Zn), titanium (Ti), rhodium (Rh), magnesium (Mg), palladium (Pd), and ruthenium (Ru).

According to an aspect of the present invention, the reflective layer 170 is made of an alloy containing 5 wt % of aluminum (Al) to silver (Ag). The Ag—Al alloy provides an excellent contact characteristic and durability while silver (Ag) has a poor contact characteristic and thermal durability.

Preferably, the reflective layer 170 is a thick layer having a thickness of 10 nanometers or more.

More preferably, the reflective layer 170 has a thickness of 100 to 1,000 nanometers.

In addition, the reflective layer 170 may be formed by using the aforementioned deposition methods.

Preferably, the multi ohmic contact layer 160 and the reflective layer 170 are sequentially formed in continuous deposition processes, and then, subject to the aforementioned thermal annealing process.

As a result, the ohmic contact electrode does not show surface degradation at a temperature of 200° C. In addition, the ohmic contact electrode is hard to oxidize. In addition, the ohmic contact electrode can maintain its unique reflectance. Therefore, a high efficient light emitting device can be implemented by using the ohmic contact electrode.

On the other hand, although only the stacked structure of the reforming metal layer 160a and, the transparent conductive thin film 160b is interposed between the p type clad layer 150 and the reflective layer 170 in the embodiment shown in FIG. 1, it can be understood by those skilled in the art that another repeatedly stacked structure of the reforming metal layer 160a, the transparent conductive thin film 160b, reforming metal layer 160a and transparent conductive thin film 160b and so on may be interposed between the p type clad layer 150 and the reflective layer 170.

Now, an embodiment of a method of manufacturing a light emitting device mainly containing gallium nitride will be described with reference to FIG. 2.

Firstly, an n type gallium nitride is grown on a substrate 110 to form an n type clad layer 130 (S210).

Next, an active layer 140 is grown on the n type clad layer 130 (S220), and then, a p type gallium nitride is grown on the active layer 140 to form a p type clad layer 150 (S230).

Next, the resultant product is subject to an etching process to be formed into an mesa structure in order to form an n type electrode pad 190 thereon.

Next, a multi ohmic contact layer 160 and a reflective layer 170 are deposited on the p type clad layer 150 by using continuous processes (S250 and S260) and subject to a thermal annealing process in the aforementioned process conditions (S270).

Alternatively, as shown in FIG. 3, after the multi ohmic contact layer 160 is formed (S250), a first thermal annealing process may be performed in the aforementioned process conditions (S360) and after the reflective layer 170 is deposited (S370), a second thermal annealing process may be performed (S380).

According to a flip-chip light emitting device and a method of manufacturing thereof, since the ohmic contact characteristics associated with a p type clad layer can be improved, it is possible to increase wire bonding efficiency and yield in a packaging process. In addition, since a low non-contact resistance and a good current-voltage characteristic can be obtained, it is possible to improve light emitting efficiency and to expand life time of the flip-chip light emitting device.

What is claimed is:

1. A flip-chip nitride light emitting device comprising:
   an n type clad layer;
   a p type clad layer;
   an active layer disposed between the n and p type clad layers; and
   a reflective layer disposed on the p type clad layer,
   wherein a multi ohmic contact layer obtained by repeatedly stacking at least two stack units, each of which includes a reforming metal layer and a transparent conductive thin film is disposed between the p type clad layer and the reflective layer, and
   wherein the reforming metal layer mainly contains silver (Ag).

2. The flip-chip nitride light emitting device according to claim 1, wherein the reforming metal layer has a thickness ranging from 1 to 20 nanometers.

3. The flip-chip nitride light emitting device according to claim 1, wherein the reflective layer is made of at least one of silver (Ag), silver oxide ($Ag_2O$), zinc (Zn), titanium (Ti), rhodium (Rh), magnesium (Mg), palladium (Pd), ruthenium (Ru), and aluminum(Al).

4. The flip-chip nitride light emitting device according to claim 1, wherein the transparent conductive thin film has a thickness ranging from 10 to 1,000 nanometers, and wherein the reflective layer has a thickness ranging from 100 to 1,000 nanometers.

5. The flip-chip nitride light emitting device according to claim 1, wherein the transparent conductive thin film is made of one of a transparent conductive oxide and a transparent conductive nitride.

6. The flip-chip nitride light emitting device according to claim 5, wherein the transparent conductive thin film is made of a material containing titanium (Ti) and nitrogen (N).

7. The flip-chip nitride light emitting device according to claim 5, wherein the transparent conductive oxide is made of a material obtained by combining oxygen (O) with at least one metal of indium (In), tin (Sn), zinc (Zn), gallium (Ga), cadmium (Cd), magnesium (Mg), beryllium (Be), silver (Ag), molybdenum (Mo), vanadium (V), copper (Cu), Iridium (Ir), rhodium (Rh), ruthenium (Ru), tungsten (W), cobalt (Co), nickel (Ni), manganese (Mn), aluminum (Al), and one of lanthanide (La) series.

* * * * *